United States Patent
Coult et al.

(10) Patent No.: US 6,625,367 B2
(45) Date of Patent: Sep. 23, 2003

(54) OPTOELECTRONIC DEVICE HAVING A P-CONTACT AND AN N-CONTACT LOCATED OVER A SAME SIDE OF A SUBSTRATE AND A METHOD OF MANUFACTURE THEREFOR

(75) Inventors: David G. Coult, Oley, PA (US); Gustav E. Derkits, Jr., New Providence, NJ (US); Charles W. Lentz, Sinking Springs, PA (US); Bryan P. Segner, Allentown, PA (US)

(73) Assignee: TriQuint Technology Holding Co., Hillsboro, OR (US)

( * ) Notice: Subject to any disclaimer, the term of this patent is extended or adjusted under 35 U.S.C. 154(b) by 44 days.

(21) Appl. No.: 09/934,098

(22) Filed: Aug. 21, 2001

(65) Prior Publication Data

US 2002/0076187 A1 Jun. 20, 2002

Related U.S. Application Data

(60) Provisional application No. 60/226,527, filed on Aug. 21, 2000.

(51) Int. Cl.[7] .............................. G02B 6/13; H01L 31/00; H01L 31/06

(52) U.S. Cl. ..................... 385/131; 257/460; 257/461
(58) Field of Search ................... 385/131; 257/13, 257/79, 184, 460, 461

(56) References Cited

U.S. PATENT DOCUMENTS

| | | | | |
|---|---|---|---|---|
| 5,208,878 A | * | 5/1993 | Thulke | 385/14 |
| 5,349,210 A | * | 9/1994 | Ackley et al. | 257/84 |
| 5,866,922 A | * | 2/1999 | Huang et al. | 257/93 |
| 5,942,789 A | * | 8/1999 | Morikawa | 257/459 |
| 6,320,206 B1 | * | 11/2001 | Coman et al. | 257/94 |
| 6,504,180 B1 | * | 1/2003 | Heremans et al. | 257/98 |
| 2002/0158294 A1 | * | 10/2002 | Fujiwara et al. | 257/431 |

* cited by examiner

*Primary Examiner*—Michael C. Zarroli
(74) *Attorney, Agent, or Firm*—Hitt Gaines, PC (57) ABSTRACT

The present invention provides an optoelectronic device that includes an optical active layer formed over a substrate and an active region formed in the optical active layer. The optoelectronic device further includes a P-contact and an N-contact formed over a same side of the substrate and associated with the active region, the N-contact is located within a trench formed in the optical active layer and contacts the substrate within the trench.

17 Claims, 5 Drawing Sheets

OPTOELECTRONIC DEVICE HAVING A P-CONTACT AND AN N-CONTACT LOCATED OVER A SAME SIDE OF A SUBSTRATE AND A METHOD OF MANUFACTURE THEREFOR

CROSS-REFERENCE TO PROVISIONAL APPLICATION

This application claims the benefit of U.S. Provisional Application No. 60/226,527 entitled "PHOTONIC CIRCUIT HAVING CO-SIDED CONTACTS WITH CO-PLANAR BONDING AREAS AND METHODS OF FABRICATION," to D. G. Coult et. al., filed on Aug. 21, 2000, which is commonly assigned with the present invention and incorporated herein by reference as if reproduced herein in its entirety.

TECHNICAL FIELD OF THE INVENTION

The present invention is directed, in general, to an optical fiber communications system and, more specifically, to an optoelectronic device having a P-contact and an N-contact located over a same side of a substrate, and a method of manufacture therefor.

BACKGROUND OF THE INVENTION

Various optical devices, such as lasers, P-type/intrinsic/N-type (PIN) photodetectors, optical lenses, and other similar devices, are currently widely used and accepted in today's complex optical communications systems. Currently, multiple optical devices are mounted to a substrate, such as an optical sub-assembly (OSA) or other similar substrate, for inclusion into an optical communications system. Typically, after the multiple optical devices are mounted on the substrate, contact pads and wire bonds are formed and connected, providing electrical connections to the various electrodes included within the various devices.

Figure 1:
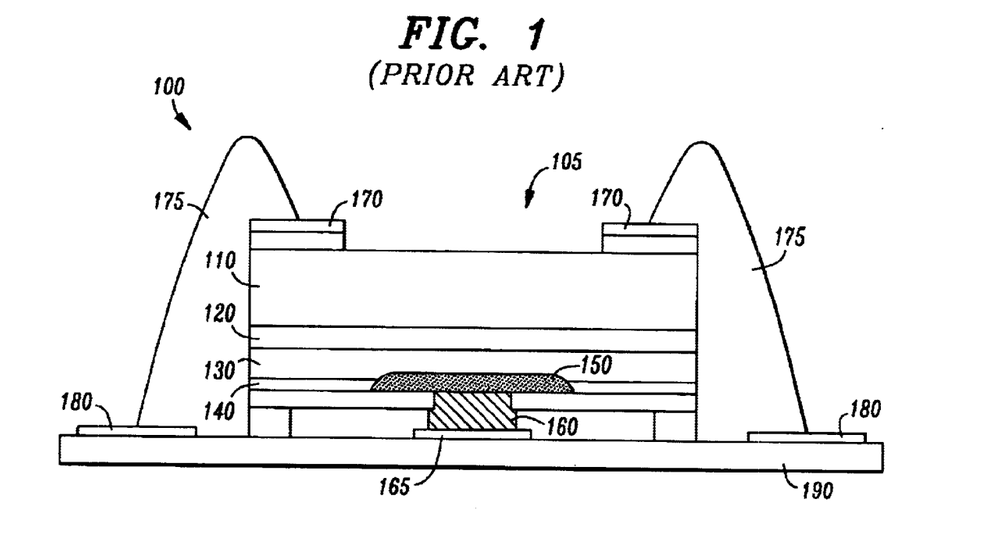
FIG. 1 illustrates a cross-sectional view of an example of a conventional optical communications sub-system, including an optical device that is mounted to an optical sub-assembly (OSA)

An example of a cross-sectional view of a conventional optical communications sub-system 100, including an optical device 105 that is mounted to an OSA 190, is illustrated in Prior Art FIG. 1, and will hereafter be described. In the current example, the optical device 105, which is illustrated as a laser or a PIN photodetector, includes an optical substrate 110 having an buffer layer 120 located thereon. The optical device 105 further includes an absorber layer 130 located on the buffer layer 120, and a cap layer 140 located on the absorber layer 130. Located within the cap layer 140 and contacting the absorber layer 130 is a P++ diffusion region 150. Likewise, contacting the P++ diffusion region 150 is a P-contact 160, and contacting the substrate 110 are N-contacts 170.

As illustrated, the P-contact 160 physically contacts a P-contact electrode 165 located on the OSA 190. However, because the N-contacts 170 are located on an opposing side of the optical device 105 from the P-contact 170, a wire bond 175 must be used to connect them to their respective N-contact electrodes 180, which are also located on the OSA 190. The inclusion of the wire bond 175 in the optical communications sub-system 100 introduces certain drawbacks, namely drawbacks associated with performance and manufacturing.

As just mentioned, the optical communications sub-system 100 experiences certain performance issues associated with the use of the wire bond 175. One of such performance issues is an undesirably high wire bond inductance. It is currently unfavorable to have such high wire bond inductance, because the high wire bond inductance causes the optical device 105 to operate slower than desired, making the device less efficient, thus less preferred in the optoelectronics industry.

As also just mentioned, the optical communications sub-system 100 experiences certain manufacturing limitations associated with the use of the wire bond 175. Because the wire bond 175 must be attached to both the N-contacts 170 and N-contact electrodes 180, an additional complex manufacturing variable has been added to the process flow. Such additional complex manufacturing variables are generally unwanted, especially when they may cause up to a 2 percent reduction in optical communications sub-system 100 yields. While the reduction in optical communications sub-system 100 yields may be attributed to many things, it may particularly be attributed to the inherent difficulty in creating a wire bond to a silicon or an indium phosphide substrate, such as used in the N-contacts 170 or the OSA 190.

Figure 2:
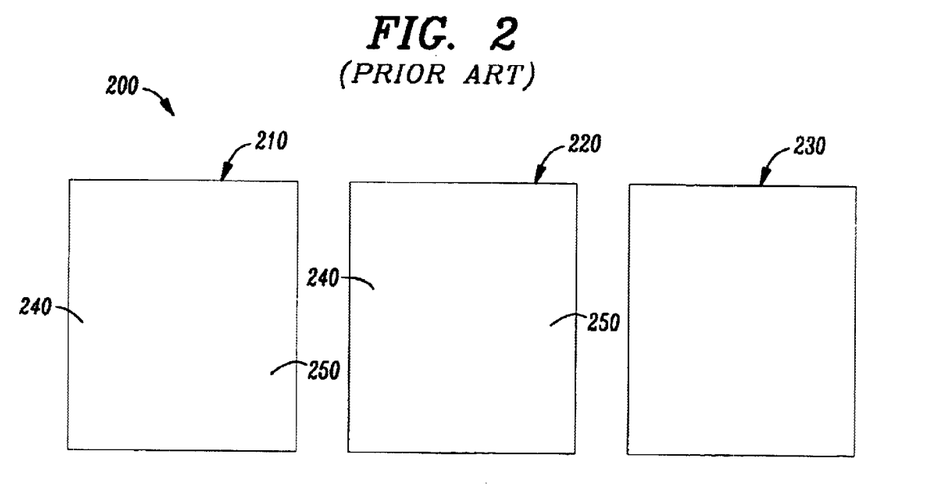
FIG. 2 illustrates micrographs illustrating examples of damage that may be caused while bonding a wire bond to an optical device.

Some of the difficulties associated with wire bonding in optical devices are demonstrated with respect to Prior Art FIG. 2. More specifically, Prior Art FIG. 2 illustrates micrographs 210, 220, 230 depicting examples of damage that may be caused while bonding a wire bond 240 to an optical device 250. In a typical situation, such a damaged optical device 250 would subsequently be discarded, substantially increasing manufacturing costs. Likewise, because the wire bond 240 is also coupled to another device, such as an OSA, damage caused while bonding the wire bond 240 to the optical device 250 may also cause a fully assembled OSA, including multiple lasers, PIN photodetectors and lens, to be damages and also subsequently discarded. Additionally, not only does the inclusion of the wire bond 240 cause yield problems, it also adds additional manufacturing time, which one skilled in the art knows is undesirable.

Accordingly, what is needed in the art is an optical device and a method of manufacture therefor, that overcomes the deficiencies in the prior art, such as the problems associated with the use of wire bonds in optical devices.

SUMMARY OF THE INVENTION

To address the above-discussed deficiencies of the prior art, the present invention provides an optoelectronic device and a method of manufacture therefor. The optoelectronic device includes an optical active layer formed over a substrate and an active region formed in the optical active layer. The optoelectronic device further includes a P-contact and an N-contact formed over a same side of the substrate and associated with the active region.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

The invention is best understood from the following detailed description when read with the accompanying FIGURES. It is emphasized that in accordance with the standard practice in the optoelectronic industry, various features may not be drawn to scale. In fact, the dimensions of the various features may be arbitrarily increased or reduced for clarity of discussion. Reference is now made to the following descriptions taken in conjunction with the accompanying drawings, in which.

DETAILED DESCRIPTION

Figure 3:
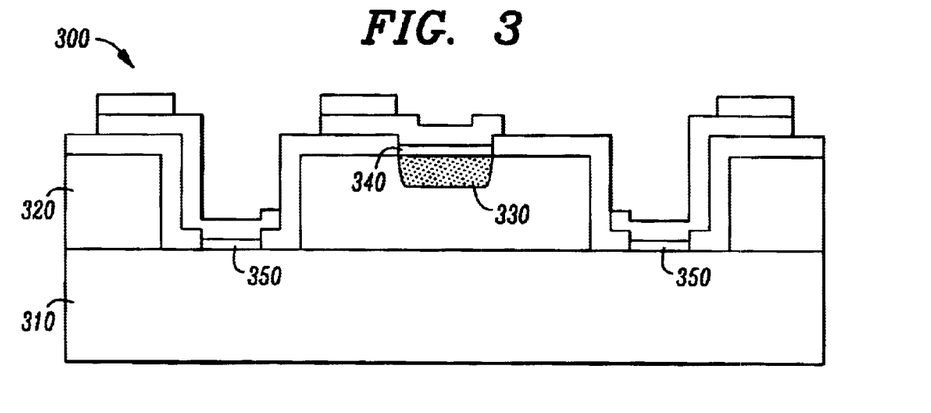
FIG. 3 illustrates a cross-sectional view of an embodiment of a completed optoelectronic device constructed in accordance with the principles of the present invention.

Referring initially to FIG. 3, illustrated is a cross-sectional view of an embodiment of a completed optoelectronic device 300 constructed in accordance with the principles of the present invention. In the embodiment shown in FIG. 3, the optoelectronic device 300 includes a substrate 310. Located over the substrate 310 is an optical active layer 320. The optical active layer 320 may include multiple layers, including a buffer layer, an absorber layer, a capping layer, or another similar layer.

Located within the optical active layer 320 in the embodiment illustrated in FIG. 3, is an active region 330. The active region 330, which may be a P++ diffusion region, helps define a P-type/intrinsic/N-type (PIN) photodetector. Electrically coupled to and associated with the active region 330, is a P-contact 340. Also associated with the active region 330, and located over a same side of the substrate 310 as the P-contact 340, is an N-contact 350. While two N-contacts 350 have been shown in the embodiment illustrated in FIG. 3, one skilled in the art understands that only one N-contact 350 is required. Two N-contacts 350 may be used when it is desired to provide both a DC bias and an AC bias.

Because the P-contact 340 and the N-contacts 350 are located over a same side of the substrate 310, the optoelectronic device 300 may be bonded to an alternative surface, such as an optical sub-assembly (OSA), without the use of wire bonds as previously required in the prior art. Because the optoelectronic device 300 may be coupled to the alternative surface using a flip-chip like technology, and more importantly, since the wire bonds may be disposed of, the optoelectronic device 300 does not substantially experience the wire bond inductance limitations as experienced in the prior art devices. Additionally, since the wire bonds may be disposed of, the optoelectronic device 300 does not substantially experience the manufacturing problems, e.g., damage issues, experienced during the process of bonding the wire bonds. As such, the manufacturing yields associated with the optoelectronic device 300 are substantially higher than associated with the prior art devices.

Additionally, the completed optoelectronic device 300 benefits by having a reduced cost of assembly. Likewise, the new manufacturing process is less complex to implement and fits into the traditional manufacturing techniques. Also, the optoelectronic device 300 does not substantially experience increased contact resistance as a result of the N-contacts 350.

Figure 4:
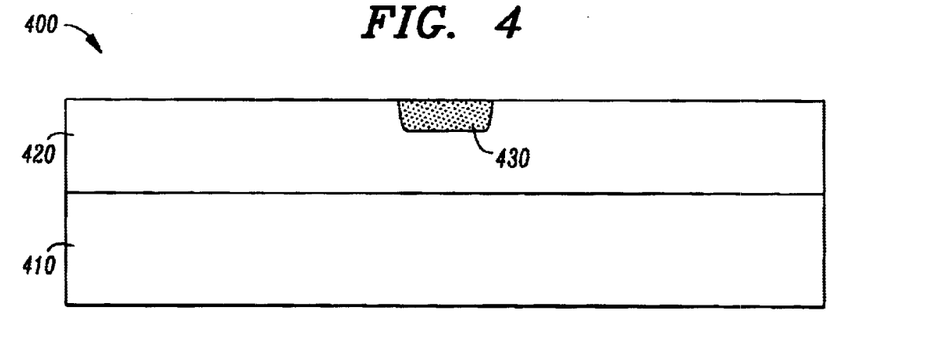
FIG. 4 illustrates a cross-sectional view of a partially completed optoelectronic device constructed in accordance with the principles of the present invention.

Turning to FIGS. 4–10, illustrated are cross-sectional views of detailed manufacturing steps instructing how one might, in an advantageous embodiment, manufacture an optoelectronic device similar to the optoelectronic device 300 depicted in FIG. 3. FIG. 4 illustrates a cross-sectional view of a partially completed optoelectronic device 400. The partially completed optoelectronic device 400 includes a substrate 410. The substrate 410 may comprise many materials, however, in one particularly advantageous embodiment, the substrate 410 comprises silicon, indium phosphide, or another similar material. Additionally, the substrate 410 may be a doped substrate, and preferably an N-type doped substrate. One having skill in the art generally understands how to form the substrate 410, and for this reason, no further discussion is herein submitted.

Formed over the substrate 410 is an optical active layer 420. The optical active layer 420, in one embodiment, may comprise multiple optical active layers. For example, in an exemplary embodiment, the optical active layer 420 may comprise a buffer layer, an absorber layer and a cap layer. In such an embodiment, any one of the buffer layer, absorber layer or cap layers may be doped to form a portion of a p-i-n region of the partially completed optoelectronic device 400. The optical active layer 420 may comprise many different materials and thicknesses, however, all of such materials and thicknesses should be consistent with the design of the respective optoelectronic device. One skilled in the art understands how to form the optical active layer 420, including depositing the optical active layer 420 using a chemical vapor deposition (CVD) or other similar process.

Further included within the embodiment illustrated in FIG. 4 is an active region 430 located within the optical active layer 420. The active region 430, which may be a doped active region, also helps form a portion of a p-i-n region of the partially completed optoelectronic device 400. The active region 430 may be formed using many processes and techniques, however, in one advantageous embodiment, a layer of photoresist is formed, patterned, and developed over the optical active layer 420, and a dopant is subsequently diffused into a portion of the optical active layer 420 not protected by the photoresist, resulting in the active region 430. In one particularly advantageous embodiment, the dopant is a P-type dopant and the active region 430 is a P-type active region.

Figure 5:
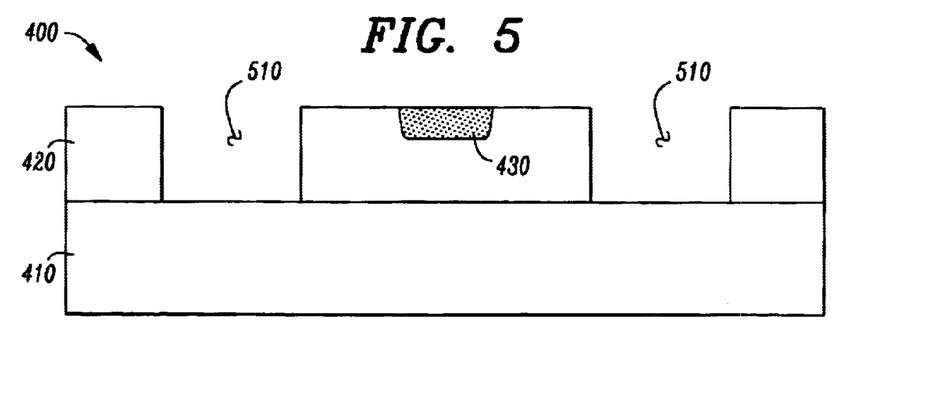
FIG. 5 illustrates a cross-sectional view of the partially completed optoelectronic device illustrated in FIG. 4, after formation of a trench within an optical active layer.

Turning to FIG. 5, illustrated is a cross-sectional view of the partially completed optoelectronic device 400 illustrated in FIG. 4, after formation of a trench 510 within the optical active layer 420. While two trenches 510 are shown in the illustrative embodiment depicted in FIG. 5, one skilled in the art understands that more than or less than two trenches are also within the scope of the present invention. For example, in one embodiment, only one trench 510 would be formed within the optical active layer 420. However, when two trenches 510 are used, such as illustrated in FIG. 5, the trenches 510 will typically be located adjacent opposing sides of the active region 430.

The trenches 510 may be formed using any conventional process. In one embodiment of the present invention, the trenches 510 are formed by depositing a layer of photoresist over the optical active layer 420, patterning and developing the layer of photoresist, thus forming photoresist portions over areas where the trenches 510 are not desired, and subsequently etching unprotected portions of the optical active layer 420. As illustrated, the trenches 510 may be formed through the optical active layer 420 and contacting the substrate 410. One skilled in the art understands how to form the trenches 510 to such a desired depth.

Additionally, the trenches 510 may be formed having various widths. In an exemplary embodiment of the present invention, the trenches 510 have widths ranging from about 25 μm to about 45 μm, and more preferably widths of about 35 μm. One understands, however, that the width of the trenches 510 depends on the design of the optoelectronic device 400, and should not be limited by the above discussions.

Figure 6:
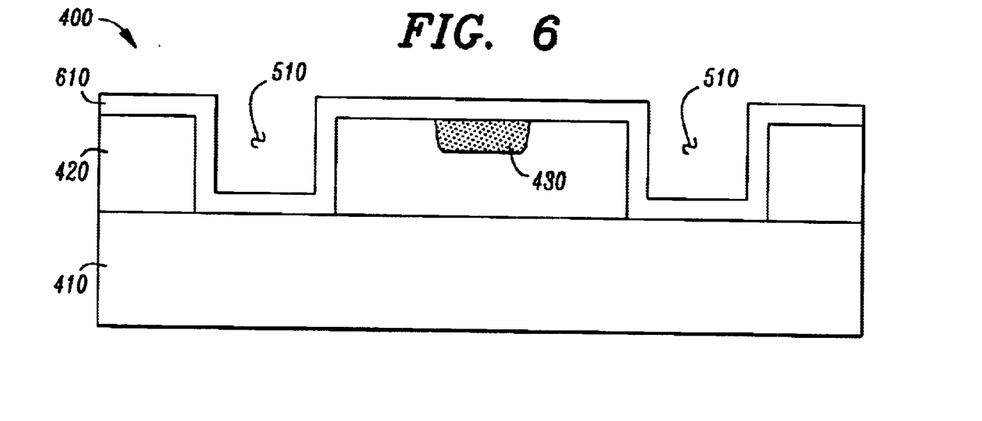
FIG. 6 illustrates a cross-sectional view of the partially completed optoelectronic device illustrated in FIG. 5, after formation of an optional insulator layer.

Turning to FIG. 6, illustrated is a cross-sectional view of the partially completed optoelectronic device 400 illustrated in FIG. 5, after formation of an optional insulator layer 610. As illustrated, the insulator layer 610 may be formed within the trenches 510 and over a surface of the optical active layer 420. The insulator layer 610 may have various material compositions and thicknesses. In an exemplary embodiment of the present invention, the insulator layer 610 is an oxide insulator layer. One skilled in the art understands the specifics of how to form the insulator layer 610, therefore, no further details are herein submitted.

Figure 7:
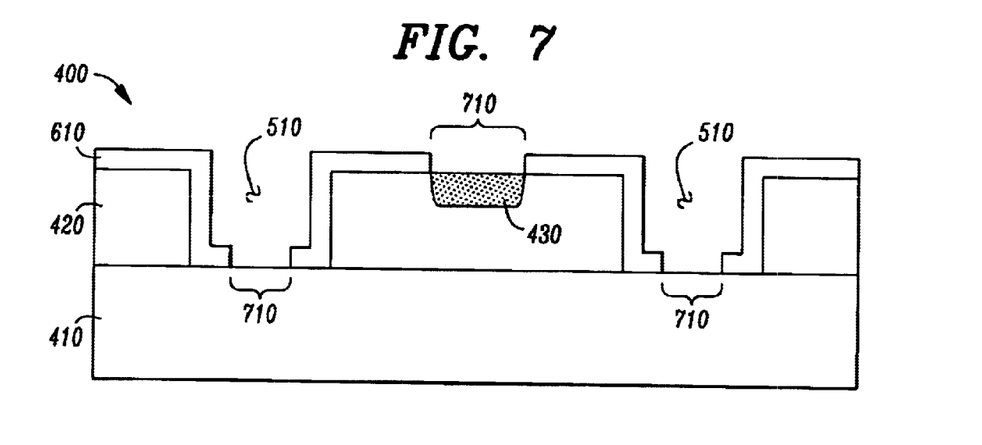
FIG. 7 illustrates a cross-sectional view of the partially completed optoelectronic device illustrated in FIG. 6, after patterning the insulator layer.

Turning to FIG. 7, illustrated is a cross-sectional view of the partially completed optoelectronic device 400 illustrated in FIG. 6, after patterning the insulator layer 610. In the illustrative embodiment shown in FIG. 6, the insulator layer 610 is patterned, resulting in open portions 710 over certain areas of the substrate 410. In an exemplary embodiment of the present invention shown, the open portions 710 are located over the active region 430 and within the trenches 510. While the open portions may be shown as over the active region 430 and within both trenches 510, it should be noted that this will not always be the case. For example, in an alternative embodiment where only one trench 510 exists, the open portions 710 would only be located over the active region 430 and within the single trench 510. Other variations are also within the scope of the present invention. Patterning an oxide layer 610 may be performed by employing conventional processes.

Figure 8:
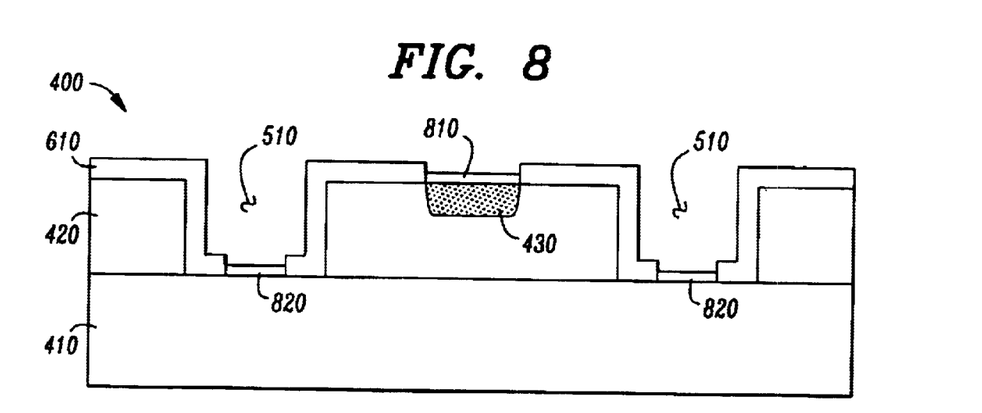
FIG. 8 illustrates a cross-sectional view of the partially completed optoelectronic device illustrated in FIG. 7, after formation of a P-contact and N-contacts.

Turning to FIG. 8, illustrated is a cross-sectional view of the partially completed optoelectronic device 400 illustrated in FIG. 7, after formation of a P-contact 810 and N-contacts 820. While two N-contacts 820 are shown in the embodiment illustrated in FIG. 8, one skilled in the art understands that only one N-contact 820 could be employed if only one trench 510 were used, and more than two N-contacts 820 could be employed if more than two trenches 510 were used. In the illustrative embodiment shown in FIG. 8, the N-contacts 820 are located within the trenches 510 formed in the optical active layer 420, and contact the substrate 410 within the trenches 510.

The P-contact 810 and N-contacts 820 may comprise many conductive materials, however, in an exemplary embodiment, the P-contact 810 and N-contacts 820 comprise an alloy, such as an alloy containing gold or germanium. Additionally, the P-contact 810 and N-contacts 820 may be formed having various thicknesses. For example, a thickness of the P-contact 810 and the N-contacts 820 may range from about 10 nm to about 60 nm. Other thicknesses, however, are also within the scope of the present invention.

One skilled in the art understands how to form the P-contact 810 and the N-contacts 820, including forming a layer of contact metal over a surface of the substrate 410 and patterning the layer of contact metal to form the P-contact 810 and the N-contacts 820. In an alternative embodiment, the P-contact 810 and the N-contacts 820 may be formed using separate steps.

Figure 9:
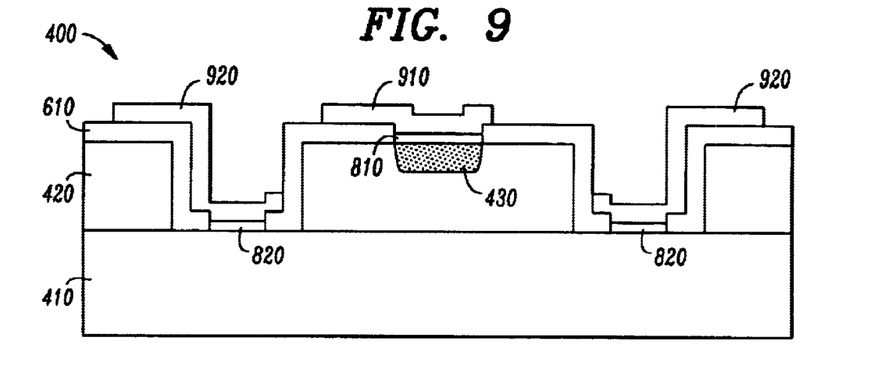
FIG. 9 illustrates a cross-sectional view of the partially completed optoelectronic device illustrated in FIG. 8, after formation of a first conductive trace contacting the P-contact, and second conductive traces contacting the N-contacts.

Turning to FIG. 9, illustrated is a cross-sectional view of the partially completed optoelectronic device 400 illustrated in FIG. 8, after formation of a first conductive trace 910 contacting the P-contact 810, and second conductive traces 920 contacting the N-contacts 820. In the illustrative embodiment shown in FIG. 9, the first and second conductive traces 910, 920 are located on a same side of the substrate 410. Additionally, the second conductive traces 910 may be partially located within the trenches 510.

One skilled in the art understands how to form the first and second conductive traces 910, 920. In an exemplary embodiment of the present invention, the first and second conductive traces 910, 920 are formed by depositing a layer of conductive material, such as a layer of an alloy containing gold, platinum and titanium, and patterning the conductive material such that the first and second conductive traces 910, 920 are formed. While it has been described that the first and second conductive traces 910, 920 are formed simultaneously, one skilled in the art understands that they may be formed using separate steps.

Figure 10:
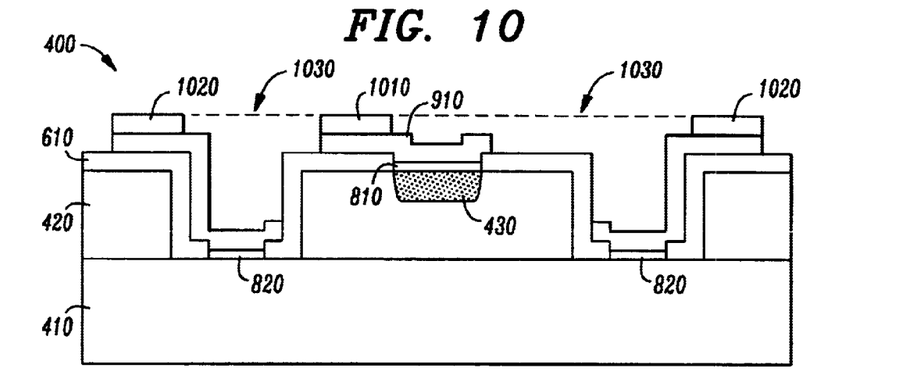
FIG. 10 illustrates a cross-sectional view of the partially completed optoelectronic device illustrated in FIG. 9, after formation of a first bonding pad contacting the P-contact, and second bonding pads contacting the N-contacts.

Turning to FIG. 10, illustrated is a cross-sectional view of the partially completed optoelectronic device 400 illustrated in FIG. 9, after formation of a first bonding pad 1010 contacting the P-contact 810, and second bonding pads 1020 contacting the N-contacts 820. In the illustrative embodiment shown in FIG. 10, the first and second bonding pads 1010, 1020 are located on a same side of the substrate 410 and are substantially coplanar 1030. The term "substantially coplanar" means that the first and second bonding pads 1010, 1020 terminate on a common plane, given minimal but normal surface variations. Because the first and second bonding pads 1010, 1020 are substantially coplanar 1030, the partially completed optoelectronic device 400 illustrated in FIG. 10 may be coupled to an alternative substrate, such as an OSA, using a flip-chip like process. Likewise, because the first and second bonding pads 1010, 1020 are located on a same side of the substrate 410, the partially completed optoelectronic device 400 may be electrically tested using less complex testing techniques. In one embodiment, the electrical tests may be accomplished by use of an efficient bar testing apparatus.

One skilled in the art understands how to form the first and second bonding pads 1010, 1020. In an exemplary embodiment of the present invention, the first and second bonding pads 1010, 1020 are formed by depositing a layer of conductive material, such as a layer of an alloy containing gold, platinum and titanium, and patterning the conductive material such that the first and second bonding pads 1010, 1020 are formed. In an alternative embodiment of the present invention, the layer of conductive material may be polished, for example using a chemical-mechanical planarization (CMP) process, such that the resulting first and second bonding pads 1010, 1020 are substantially coplanar. After completion of the first and second bonding pads 1010, 1020, a device similar to the completed optoelectronic device 300 illustrated in FIG. 3 results.

Figure 11:
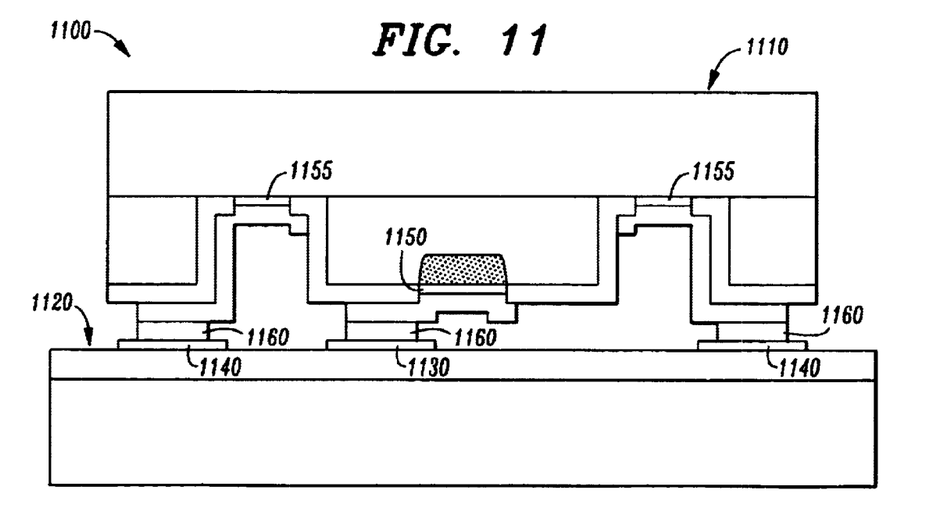
FIG. 11 illustrates a cross-sectional view of an embodiment of an optical fiber communication system, which may form one environment in which an optoelectronic device constructed in accordance with the principles of the present invention may be used.

Turning to FIG. 11, illustrated is a cross-sectional view of an embodiment of an optical fiber communication system 1100, which may form one environment in which an optoelectronic device constructed in accordance with the principles of the present invention may be used. In the embodiment illustrated in FIG. 11, the optical fiber communication system 1100 includes a first optical device 1110, which is similar to the optoelectronic device 300 illustrated in FIG. 3, having a second optical device 1120 coupled thereto. In the illustrative embodiment shown in FIG. 11, the second optical device 1120 is an OSA, however, other devices are within the scope of the present invention. Additionally, in the illustrative embodiment shown in FIG. 11, the first optical device 1110 is a laser or a PIN photodetector.

As illustrated, the first optical device 1110 is coupled to the second optical device 1120 using pads 1130, 1140. Such pads 1130, 1140 allow a P-contact 1150 and N-contacts 1155 of the first optical device 1110, to be electrically contacted for operation or testing thereof. Notice that by judicious placement of the pads 1130, 1140, the first optical device 1110 may be easily and quickly coupled to the second optical device 1120. Placement may, however, require solder regions 1160 to couple the pads 1130, 1140 and the P-contact 1150 and N-contacts 1155, respectively. It should be noted that in an alternative embodiment of the present invention, various other alternative optical devices may be included with the first or second optical device 1110, 1120.

Figure 12:
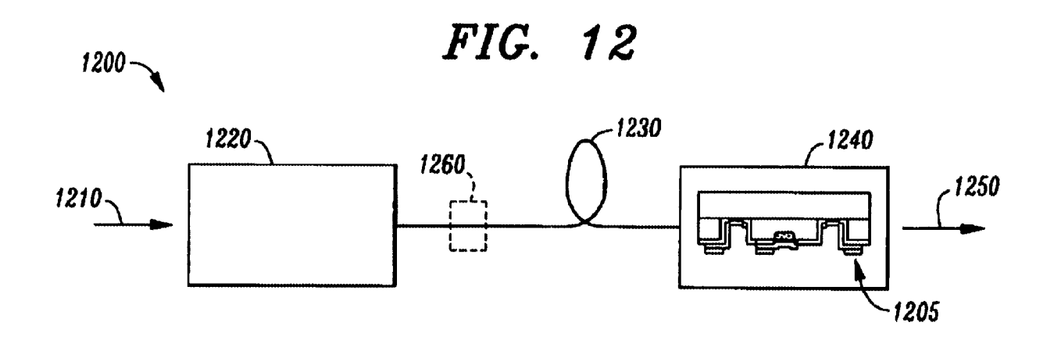
FIG. 12 illustrates a cross-sectional view of an embodiment of an optical fiber communication system, which may form one environment in which an optoelectronic device constructed in accordance with the principles of the present invention may be used.

Turning to FIG. 12, illustrated is a cross-sectional view of an embodiment of an optical fiber communication system 1200, which may form one environment in which an optoelectronic device constructed in accordance with the principles of the present invention may be used. An initial signal 1210 enters a transmitter 1220 of the optical fiber communications system 1200. The transmitter 1220 receives the initial signal 1210, addresses the signal 1210 and sends any resulting information across an optical fiber 1230 to a receiver 1240. The receiver 1240 receives the information via the optical fiber 1230, addresses the information and sends an output signal 1250. As illustrated in FIG. 12, an optoelectronic device 1205 similar to the optoelectronic device 300, may be included within the receiver 1240. However, the optoelectronic device 1205 may also be included anywhere in the optical fiber communication system 1200, including the transmitter 1220. The optical fiber communication system 1200 is not limited to the devices previously mentioned. For example, the optical fiber communication system 1200 may include an element 1260, such as a laser, diode, modulator, optical amplifier, optical waveguide, or other similar device.

Figure 13:
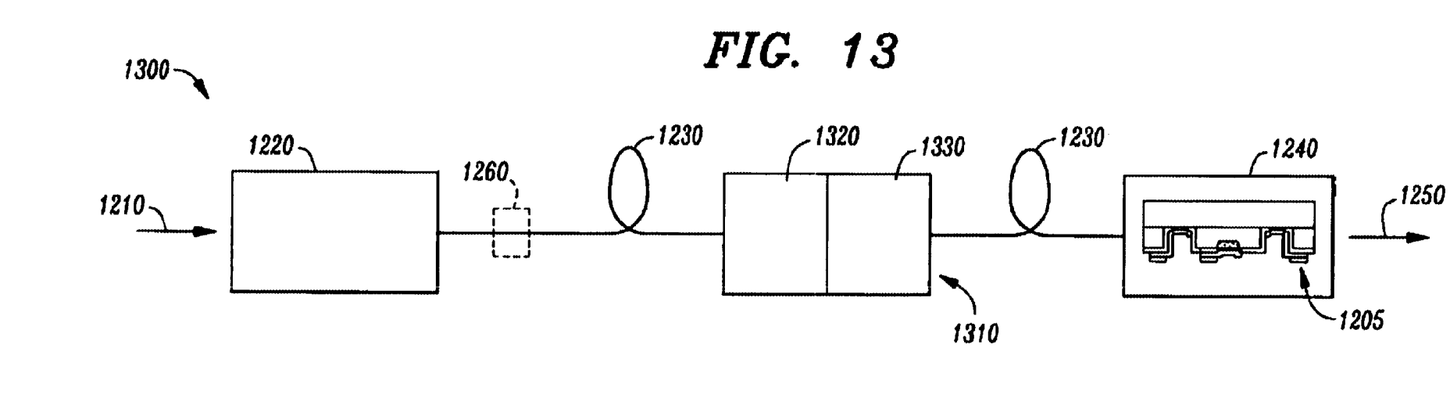
FIG. 13 illustrates a cross-sectional view of an embodiment of an optical fiber communication system, having a repeater, which includes a second transmitter and a second receiver located between a transmitter and a receiver.

Turning briefly to FIG. 13, illustrated is a cross-sectional view of an embodiment of an alternative optical fiber communication system 1300, having a repeater 1310, including a second transmitter 1320 and a second receiver 1330, located between the transmitter 1220 and the receiver 1240. The optical fiber communication system 1300 may form one environment in which a completed optoelectronic device similar to the completed optoelectronic device 300 in FIG. 3 may be used.

Although the present invention has been described in detail, those skilled in the art should understand that they can make various changes, substitutions and alterations herein without departing from the spirit and scope of the invention in its broadest form.

What is claimed is:

1. An optoelectronic device, comprising
   an optical active layer located over a substrate;
   an active region located in the optical active layer; and
   a P-contact and an N-contact associated with the active region and located over a same side of the substrate, wherein the N-contact is located within a trench formed in the optical active layer and contacts the substrate within the trench.

2. The optoelectronic device as recited in claim 1 wherein the N-contact is a first N-contact and further includes a second N-contact located over the same side.

3. The optoelectronic device as recited in claim 1 further including a first bonding pad contacting the P-contact and a second bonding pad contacting the N-contact, wherein the first and second bonding pads are located over the same side.

4. The optoelectronic device as recited in claim 3 wherein the first bonding pad and second bonding pad are substantially coplanar.

5. The optoelectronic device as recited in claim 1 further including a first conductive trace that connects the P-contact to a first bonding pad and a second conductive trace located at least partially within the trench that connects the N-contact to a second bonding pad, wherein the first and second bonding pads are located over the same side.

6. The optoelectronic device as recited in claim 1 further including an insulator layer located within the trench and partially over the optical layer.

7. A method of manufacturing an optoelectronic device, comprising:
   placing an optical active layer over a substrate;
   creating an active region in the optical active layer; and
   forming a P-contact and an N-contact associated with the active region over a same side of the substrate, including the N-contact within a trench formed in the optical active layer and that contacts the substrate within the trench.

8. The method as recited in claim 7 wherein forming an N-contact includes forming a first N-contact and further includes forming a second N-contact over the same side.

9. The method as recited in claim 7 further including forming a first bonding pad contacting the P-contact and forming a second bonding pad contacting the N-contact, wherein the first and second bonding pads are located over the same side.

10. The method as recited in claim 9 wherein forming the first bonding pad and forming the second bonding pad includes forming the first bonding pad and forming the second bonding pad that are substantially coplanar.

11. The method as recited in claim 1 further including forming a first conductive trace that connects the P-contact to a first bonding pad and forming a second conductive trace located at least partially within the trench that connects the N-contact to a second bonding pad, wherein the first and second bonding pads are located over the same side.

12. The method as recited in claim 7 further including forming an insulator layer between the P-contact and the N-contact.

13. An optical fiber communications system, comprising:
a first optical device, which includes an optical active layer located over a substrate, an active region located in the optical active layer and a P-contact and an N-contact associated with the active region and located over a same side of the substrate, wherein the N-contact is located within a trench formed in the optical active layer and contacts the substrate within the trench; and
a second optical device coupled to the first optical device.

14. The optical fiber communications system as recited in claim 13 wherein the first optical device further includes a first bonding pad contacting the P-contact and a second bonding pad contacting the N-contact, wherein the first and second bonding pads are located over the same side.

15. The optical fiber communications system as recited in claim 14 wherein the first bonding pad and second bonding pad are substantially coplanar.

16. The optical fiber communications system recited in claim 13 wherein the first optical device is a laser or a photodetector.

17. The optical fiber communications system as recited in claim 13 further including devices selected from the group consisting of:
optical sub assemblies,
modulators,
optical amplifiers, and
optical waveguides.

* * * * *